(12) United States Patent
Cho

(10) Patent No.: US 9,183,917 B1
(45) Date of Patent: Nov. 10, 2015

(54) MEMORY DEVICE, OPERATING METHOD THEREOF, AND SYSTEM HAVING THE MEMORY DEVICE

(71) Applicant: Samsung Electronics Co., Ltd., Suwon-si (KR)

(72) Inventor: Yong-Ho Cho, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/103,202

(22) Filed: Dec. 11, 2013

Related U.S. Application Data

(60) Provisional application No. 61/740,706, filed on Dec. 21, 2012.

(51) Int. Cl.
*G11C 11/406* (2006.01)

(52) U.S. Cl.
CPC .................................. *G11C 11/406* (2013.01)

(58) Field of Classification Search
CPC ........ G11C 7/1006; G11C 7/14; G11C 7/062; G11C 7/22; G11C 11/406; G11C 11/4076; G11C 29/02; G11C 11/4074; G11C 8/18
See application file for complete search history.

(56) References Cited

U.S. PATENT DOCUMENTS

| | | | |
|---|---|---|---|
| 5,644,545 A | 7/1997 | Fisch | |
| 5,777,921 A * | 7/1998 | Takata et al. | 365/145 |
| 6,518,595 B2 | 2/2003 | Lee | |
| 6,894,917 B2 | 5/2005 | Ting et al. | |
| 6,934,211 B2 | 8/2005 | Hazama et al. | |
| 7,079,439 B2 | 7/2006 | Cowles et al. | |
| 7,158,434 B2 | 1/2007 | Hokenmaier | |
| 7,301,843 B2 | 11/2007 | Tsukude | |
| 7,768,859 B2 | 8/2010 | Oh | |
| 8,009,498 B2 | 8/2011 | Chang et al. | |
| 2007/0033339 A1* | 2/2007 | Best et al. | 711/106 |
| 2007/0070764 A1 | 3/2007 | Miyamoto et al. | |
| 2007/0183242 A1 | 8/2007 | Miyamoto | |
| 2008/0151669 A1 | 6/2008 | Bill et al. | |
| 2009/0190409 A1 | 7/2009 | Dittrich et al. | |
| 2011/0110175 A1 | 5/2011 | Chang et al. | |
| 2011/0122687 A1* | 5/2011 | Kwon et al. | 365/185.02 |
| 2012/0243299 A1 | 9/2012 | Shau | |
| 2013/0097403 A1 | 4/2013 | Zheng et al. | |
| 2014/0095780 A1 | 4/2014 | Bains et al. | |

FOREIGN PATENT DOCUMENTS

| | | |
|---|---|---|
| JP | 5019410 | 9/2006 |
| JP | 4721815 | 2/2007 |
| KR | 100138700 | 7/1996 |

* cited by examiner

*Primary Examiner* — James G Norman
(74) *Attorney, Agent, or Firm* — Muir Patent Law, PLLC

(57) ABSTRACT

A method of operating a memory device including a plurality of memory cells may include counting a number of times that the plurality of memory cells during a first time period, comparing the number of times to a reference number, and controlling a refresh interval of a refresh operation for the plurality of memory cells based on a result of the comparison.

13 Claims, 18 Drawing Sheets

MEMORY DEVICE, OPERATING METHOD THEREOF, AND SYSTEM HAVING THE MEMORY DEVICE

CROSS-REFERENCE TO RELATED APPLICATIONS

This application claims priority under 35 U.S.C. §119(e) to U.S. Provisional Patent Application No. 61/740,706 filed on Dec. 21, 2012 in the United States Patent and Trademark Office (USPTO), the disclosure of which is hereby incorporated by reference in its entirety.

BACKGROUND

This disclosure relates to a memory device, and more particularly to a memory device which may control a refresh interval of a refresh operation for the plurality of memory cells, an operation method thereof, and a system including the memory device.

A memory device includes a memory cell array including a plurality of memory cells. According to a recent tendency of high integration, a distance between the plurality of memory cells of the memory cell array has been very narrowed.

Accordingly, when a memory access operation is concentrated on specific memory cells among the plurality of memory cells, cells adjacent to the specific memory cells are disturbed by the memory access operation.

SUMMARY

An example embodiment of the present disclosure is directed to a method of operating a memory device including a plurality of memory cells. The method includes counting a number of times that the plurality of memory cells are accessed during a first time period, comparing the number of times to a reference number, and controlling the refresh interval of the refresh operation for the plurality of memory cells based on a result of the comparison.

An example embodiment of the present disclosure is directed to a memory device. The memory device includes a plurality of memory cells, an access control circuit configured to control an access to the plurality of memory cells, and a control logic configured to control a refresh interval of a refresh operation for the plurality of memory cells based on the number of accesses to the plurality of memory cells during a first time period, and schedule the refresh operation at the controlled refresh interval.

Another example embodiment of the present disclosure is directed to a method of operating a memory device including a plurality of memory cells connected to a plurality of word lines is disclosed. The method includes counting a number of times that each of the plurality of word lines is accessed during a first time period, comparing the number of times to a reference number, and performing a refresh operation on the plurality of word lines based on a result of the comparison.

DETAILED DESCRIPTION OF THE EMBODIMENTS

Figure 1:
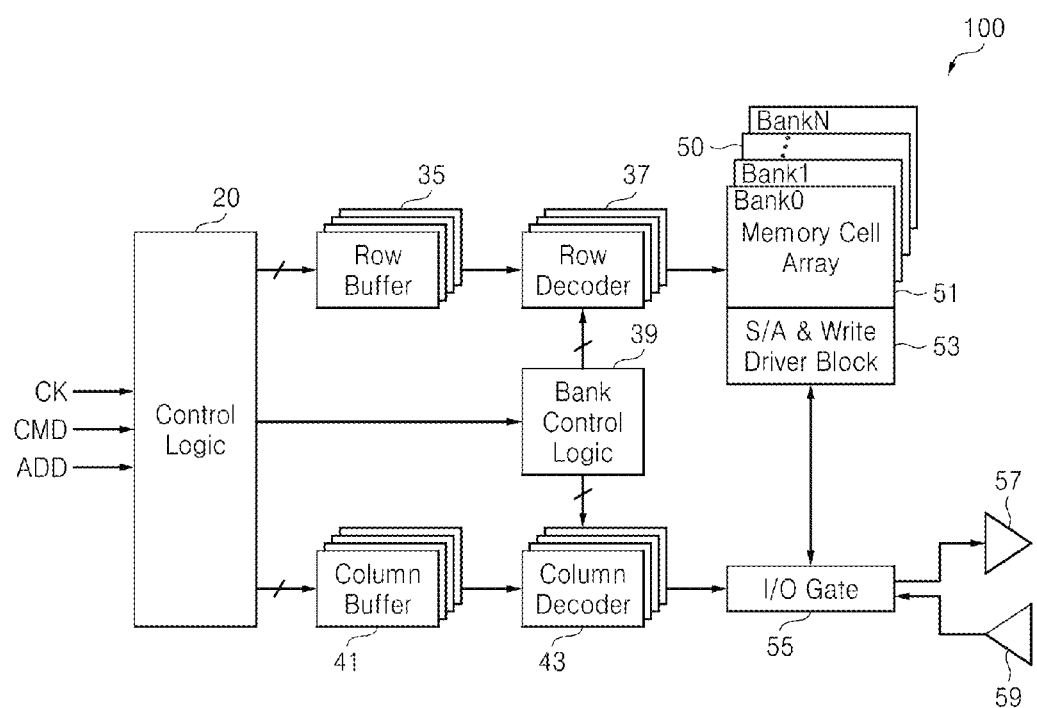
FIG. 1 is a block diagram of a memory device according to exemplary embodiments.

Various exemplary embodiments will be described more fully with reference to the accompanying drawings, in which exemplary embodiments are shown. The disclosure may, however, be embodied in many different forms and should not be construed as being limited to the embodiments set forth herein. In the drawings, the thicknesses of layers and regions are exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms unless the context indicates otherwise. Unless indicated otherwise, these terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a memory device according to exemplary embodiments. Referring to FIG. 1, a memory device 100 may be a dynamic random access memory (DRAM); however, it is not restricted thereto.

The memory device 100 may include a control logic 20, a plurality of row buffers 35, a plurality of row decoders 37, a bank control logic 39, a plurality of column buffers 41, a plurality of column decoders 43, a plurality of banks 50, an input/output gate 55, an output driver 57, and an input buffer 59.

The control logic 20 may control each component 35, 39, and 41 in response to a plurality of signals, e.g., a clock signal CK, a command signal CMD, and an address signal ADD. The control logic 20 may control a refresh operation of the memory device 100. For example, the control logic 20 may control a refresh interval of the refresh operation according to a disturb amount, and schedule the refresh operation at the controlled refresh interval.

For example, when a memory access concentrates on specific memory cells among a plurality of memory cells included in the plurality of banks 50, the disturb amount may denote effects that memory cells adjacent or close to the specific memory cells receive by the memory access. The control logic 20 will be described in detail referring to FIG. 2.

A 'refresh interval' described in the present disclosure may denote a refresh cycle.

A command signal CMD may denote a combination of a plurality of commands, e.g., CS, RAS, CAS, and/or WE. According to an example embodiment, the command signal CMD may be transmitted from a memory controller (not shown). An address signal ADD may include address information of a memory cell(s) which is an object of the refresh operation. According to an example embodiment, the address signal ADD may be transmitted from the memory controller; however, it may be generated in the memory device 100 and not restricted thereto.

Each of the plurality of row buffers 35 may buffer a row address output from the control logic 20. According to an example embodiment, the plurality of row buffers 35 may be embodied in one row buffer; however, it is not restricted thereto.

A row decoder corresponding to a bank selected by the bank control logic 39 among the plurality of row decoders 37 may decode a row address output from a row buffer corresponding to the bank among the plurality of row buffers 35. According to an example embodiment, the plurality of row decoders 37 may be embodied in one row decoder; however, it is not restricted thereto.

The bank control logic 39 may select at least one of the plurality of banks 50 according to a control of the control logic 20.

Each of the plurality of column buffers 41 may buffer a column address output from the control logic 20. According to an example embodiment, the plurality of column buffers 41 may be embodied in one column buffer; however, it is not restricted thereto. A column decoder corresponding to a bank selected by the bank control logic 39 among the plurality of column decoders 43 may decode a column address output from a column buffer corresponding to the bank among the plurality of column buffers 41. According to an example embodiment, the plurality of column decoders 43 may be embodied in one column decoder; however, it is not restricted thereto.

Each of the plurality of banks 50 may further include a memory cell array 51 and a sense amplifier & write driver block 53. For convenience of description, it is illustrated that each of the plurality of banks 50 is embodied in a different layer; however, the scope of the present inventive concepts is not be limitedly understood by a structure and layout of the plurality of banks 50.

The memory cell array 51 includes a plurality of word lines or row lines, a plurality of bit lines or column lines, and a plurality of memory cells for storing data. The sense amplifiers & write driver block 53 may operate as a sense amplifier sensing and amplifying a voltage change of each bit line when the memory device 100 performs a read operation. The sense amplifiers & write driver block 53 may operate as a write driver which may drive each of a plurality of bit lines included in the memory cell array 51 when the memory device 100 performs a write operation.

The input/output gate 55 may transmit data or signals output from the sense amplifiers & write driver block 53 to the output driver 57 in response to a column selection signal output from one of the plurality of column decoders 43. According to an example embodiment, the input/output gate 55 may transmit data or signals input through the input buffer 59 to the sense amplifiers & write driver block 53 in response to the column selection signal.

The output driver 57 may output data or signals transmitted from the input/output gate 55 to outside the memory device 100. The input buffer 59 may transmit data or signals input from the outside the memory device 100 to the input/output gate 55.

Figure 2:
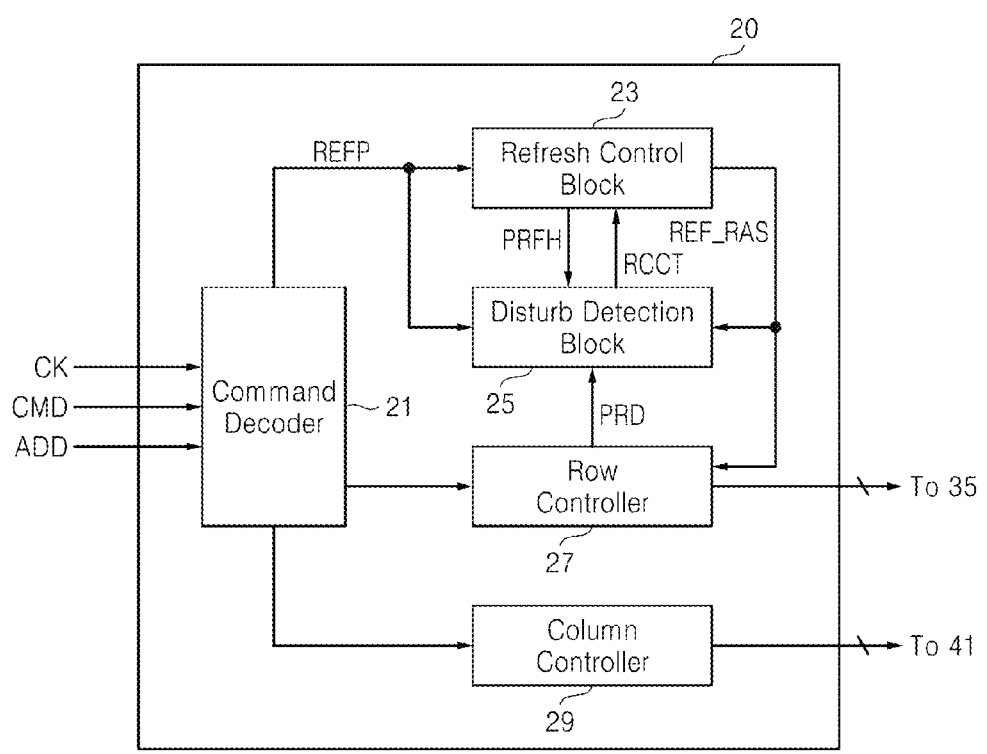
FIG. 2 is a schematic block diagram of a control logic illustrated in FIG. 1 according to an example embodiment.
Figure 3:
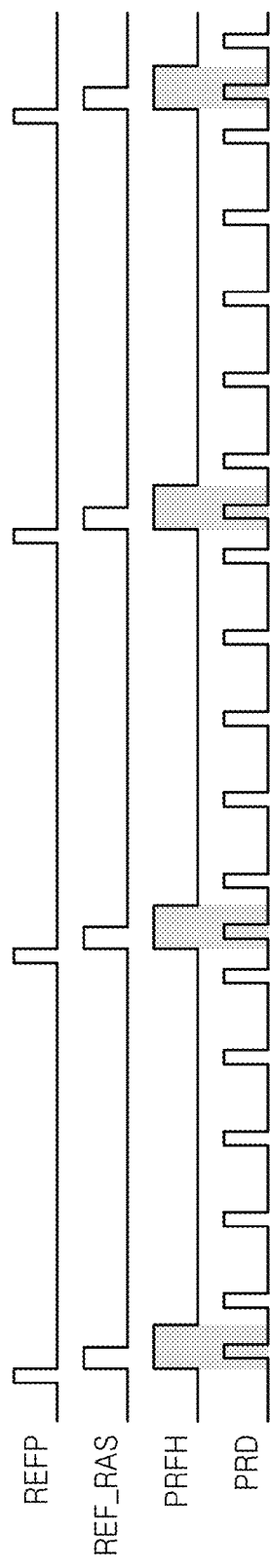
FIG. 3 is a timing diagram of internal signals occurring in the control logic illustrated in FIG. 1 according to an example embodiment.

FIG. 2 is a schematic block of the control logic illustrated in FIG. 1 according to an example embodiment, and FIG. 3 is a timing diagram of internal signals occurring inside the control logic illustrated in FIG. 1 according to an example embodiment.

Referring to FIGS. 1 to 3, the control logic 20 may control a refresh interval of a refresh operation for the plurality of memory cells based on the number of accesses of an access control circuit to a plurality of memory cells (e.g., to a plurality of word lines) included in the plurality of banks 50 when performing a normal memory access operation, e.g., an active operation, a read operation, or a write operation, during a fixed time, and schedule the refresh operation at the controlled refresh interval.

For example, the access control circuit may denote the plurality of row buffers 35, the plurality of row decoders 37, the bank control logic 39, the plurality of column buffers 41, and the plurality of column decoders 43.

The control logic 20 may include a command decoder 21, a refresh control block 23, a disturb detection bock 25, a row controller 27, and a column controller 29.

According to an example embodiment, the command decoder 21, the refresh control block 23, the disturb detection block 25, the row controller 27, and/or the column controller 29 may be separately embodied outside the control logic 21. The command decoder 21 may decode a command signal CMD configured from a combination of a plurality of signals, e.g., CS, RAS, CAS, and/or WE, based on a clock signal CK, and generate a command for controlling each component 23, 25, 27, 29, 35, 39, and 41 according to a result of the decoding.

The command decoder 21 may generate a command for performing various types of operations, e.g., an active operation, a read operation, a write operation, or a refresh operation, by decoding the command signal CMD. For example, the command decoder 21 may generate a refresh command, e.g., a refresh command signal REFP, for performing a refresh operation by decoding the command signal CMD. As illustrated in FIG. 3, the command decoder 21 may generate the refresh command REFP according to the command signal CMD transmitted from outside.

The command decoder 21 may output the refresh command signal REFP to the refresh control block 23 and the disturb detection block 25.

The refresh control block 23 may control a refresh operation of the memory device 100 in response to the refresh command signal REFP. The refresh control block 23 may control a refresh interval for the memory device 100 in response to an output signal RCCT of the disturb detection block 25, and schedule a refresh operation of the memory device 100 at the controlled refresh interval. For example, a refresh operation for all the plurality of memory cells of the memory device 100 may be finished during a refresh cycle.

Figure 4:
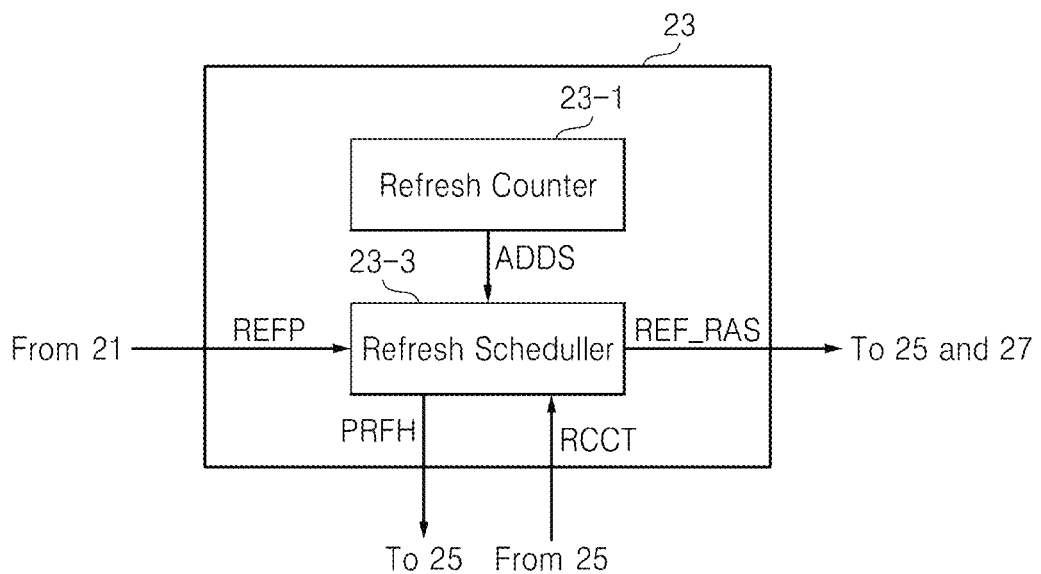
FIG. 4 is a schematic block diagram of a refresh control block illustrated in FIG. 2 according to an example embodiment.

FIG. 4 is a schematic block diagram of the refresh control block illustrated in FIG. 2 according to an example embodiment. Referring to FIGS. 1 to 4, the refresh control block 23 may include a refresh counter 23-1 and a refresh scheduler 23-3.

The refresh counter 23-1 may transmit a row address ADDS of an object of a refresh operation to the refresh scheduler 23-3. For example, the object of the refresh operation may be a semiconductor chip, a bank, a row block, or a row line according to a control of the refresh scheduler 23-3. Here, the row address ADDS may include a plurality of row addresses. For example, a memory device may include one or more semiconductor chips, a semiconductor chip may include one or more banks, a bank may include one or more row blocks, and a row block may include one or more row lines.

The refresh scheduler 23-3 may control a refresh operation of a plurality of memory cells included in the memory device, e.g., the plurality of banks 50, in response to the refresh command signal REFP.

The refresh scheduler 23-3 may generate an internal signal, e.g., a refresh performance signal PRFH, which indicates that the memory device 100 is in the middle of performing a refresh operation in response to the refresh command signal REFP, and output the refresh performance signal PRFH to the disturb detection block 25. As illustrated in FIG. 3, the refresh scheduler 23-3 may generate the refresh performance signal PRFH according to the refresh command signal REFP.

The refresh scheduler 23-3 may generate a refresh address signal REF_RAS including row address information ADDS, and output the generated refresh address signal REF_RAS to the disturb detection block 25 and the row controller 27. As illustrated in FIG. 3, the refresh scheduler 23-3 may generate the refresh address signal REF_RAS according to the refresh command signal REFP.

According to an example embodiment, the refresh address signal REF_RAS may denote a signal indicating each of the plurality of banks 50 is in the middle of performing the refresh operation.

The refresh scheduler 23-3 may control a refresh interval of the refresh operation of the memory device 100 in response to a refresh control signal RCCT output from the disturb detection block 25, and schedule a refresh operation of a plurality of memory cells included in the plurality of banks 50 at the controlled refresh interval. For example, the refresh scheduler 23-3 may enlarge, reduce, or maintain the refresh interval.

The refresh scheduler 23-3 may control the refresh interval for a semiconductor chip, a bank, a row block, or a row line.

According to an example embodiment, the refresh scheduler 23-3 may re-control the controlled refresh interval of the refresh operation of the memory device 100, and schedule the refresh operation of the memory device 100 at the re-controlled refresh interval. For example, the re-controlled refresh interval may be a refresh interval before the memory device 100 is performed a refresh operation at the controlled refresh interval.

The disturb detection block 25 may generate a refresh control signal RCCT for controlling a refresh interval of a refresh operation of a plurality of memory cells based on the number of accesses to the plurality of memory cells included in the plurality of banks 50 when performing a normal memory access operation, e.g., an active operation, a read operation, or a write operation, during a fixed time.

When a plurality of memory cells are all refreshed during a fixed time (or a refresh cycle) after a refresh operation starts to be performed on the plurality of memory cells included in the plurality of banks 50 at a controlled refresh interval, the disturb detection block 25 may generate a refresh control signal RCCT for controlling the controlled refresh interval.

For example, the disturb detection block 25 may determine a disturb amount based on the number of accesses to the plurality of memory cells (or a plurality of word lines) included in the plurality of banks 50 when performing a normal memory access operation, e.g., an active operation, a read operation or a write operation, during a fixed time. The disturb detection block 25 will be described in detail referring to FIG. 5.

The row controller 27 may select one of a row address ADDS included in a refresh address signal REF_RAS output from the refresh control block 23 and a row address output from the command decoder 21 according to a control of the command decoder 21.

According to an example embodiment, when a refresh operation performs, the row controller 27 may select a row address ADDS included in the address signal REF_RAS output from the refresh control block 23. According to another example embodiment, when performing a normal memory access operation, e.g., an active operation, a read operation, or a write operation, the row controller 27 may select a row address output from the command decoder 21.

As illustrated in FIG. 3, the row controller 27 may generate an active signal PRD whenever the plurality of memory cells (or the plurality of word lines) included in the plurality of banks 50 are accessed or are active according to various types of operations, e.g., a read operation, a write operation, or a refresh operation, and output the active signal PRD to the disturb detection block 25. For example, the active signal PRD generated according to a refresh operation may be generated in a period where the refresh performance signal PRFH is activated. The column controller 29 may output a column address to each of the plurality of column buffers 41 according to a control of the command decoder 21.

Figure 5:
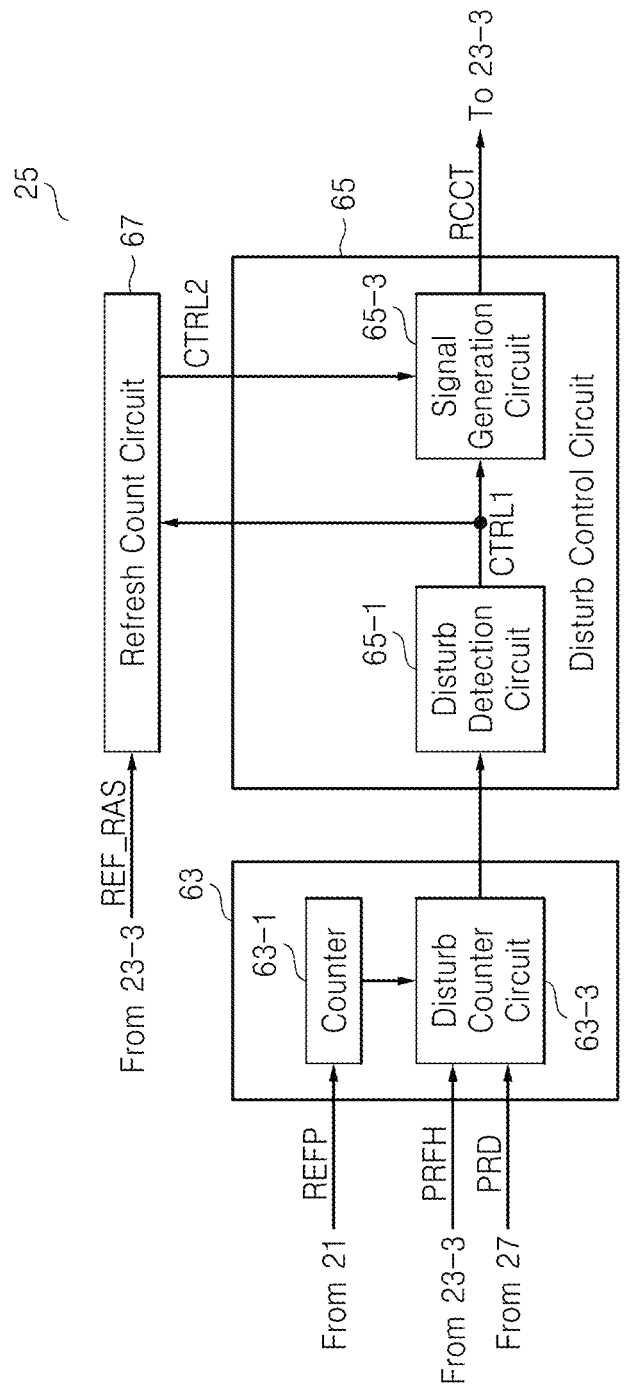
FIG. 5 is a schematic block diagram of a disturb detection block illustrated in FIG. 2 according to an example embodiment.
Figure 6:
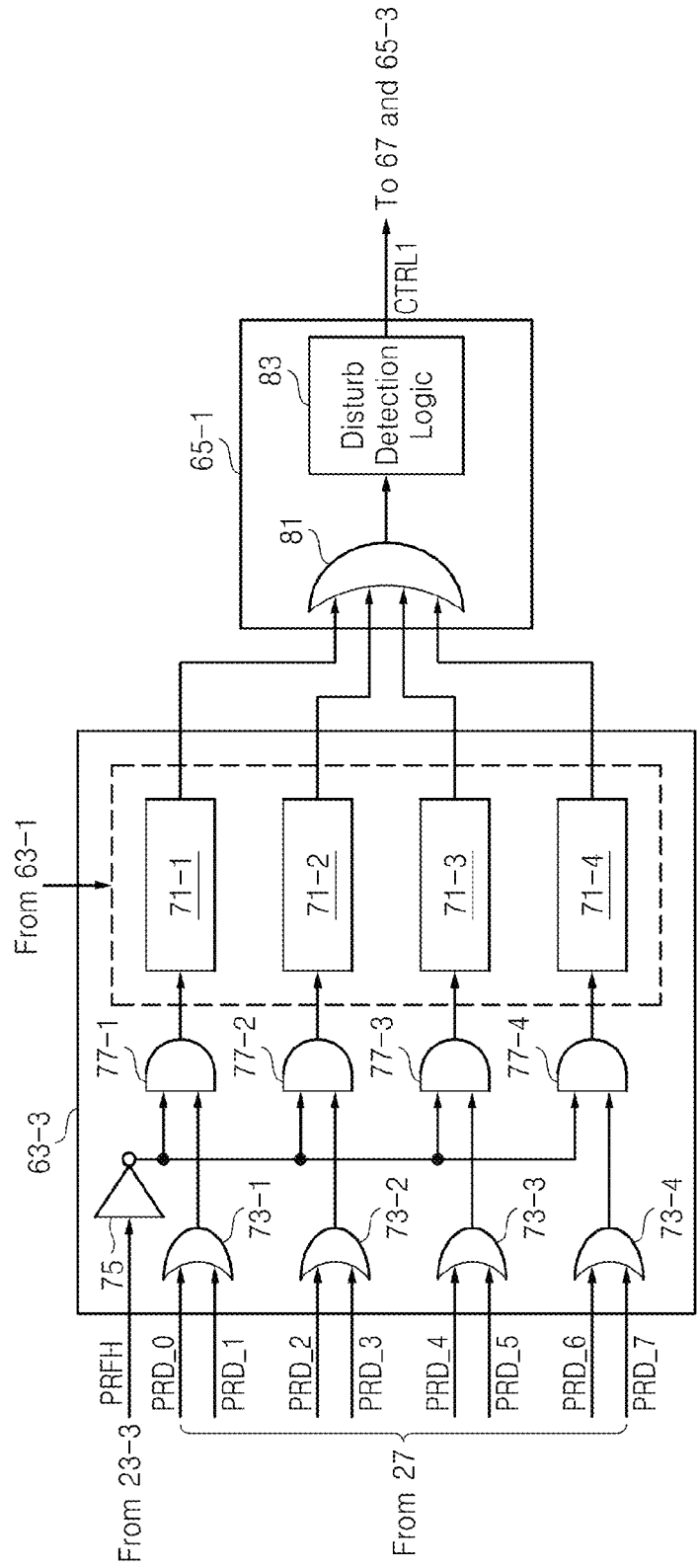
FIG. 6 is a circuit diagram according to an example embodiment of a disturb count circuit and the disturb detection circuit illustrated in FIG. 5.

FIG. 5 is a schematic block diagram of the disturb detection block illustrated in FIG. 2 according to an example embodiment, and FIG. 6 is a circuit diagram according to an example embodiment of the disturb count circuit and the disturb detection circuit illustrated in FIG. 5. Referring to FIGS. 1 to 6, the disturb detection block 25 may include a disturb count block 63, a disturb control circuit 65, and a refresh count circuit 67.

The disturb count block 63 may count the number of accesses to the plurality of memory cells (or the plurality of word lines) included in the plurality of banks 50 when performing a normal memory access operation, e.g., an active operation, a read operation, or a write operation, during a fixed time based on the refresh performance signal PRFH and the active signal PRD, and output the counted number of accesses to the disturb control circuit 65.

The disturb count block 63 may include a counter 63-1 and a disturb count circuit 63-3. The counter 63-1 may count a refresh command signal PEFP to the reference number. According to an example embodiment, the counter 63-1 may reset the disturb count circuit 63-3 after a fixed time, e.g., after counting a refresh command signal REFP to the reference number. For example, the fixed time may be determined by the number of the refresh command signals REFP, e.g., refresh commands input from outside the memory device.

The disturb count circuit 63-3 may count the number of accesses to the plurality of memory cells included in the plurality of banks 50 during a fixed time, e.g., while the counter 63-1 counts the refresh command signals REFP to the reference number, based on the refresh performance signal PRFH and the active signal PRD. According to an example embodiment, the number of accesses may be counted for a semiconductor chip, a bank, a row block, or a row line.

The disturb count circuit 63-3 may output the counted number of accesses to the disturb control circuit 65. The disturb count circuit 63-3 may include a plurality of OR gates 73-1 to 73-4, an inverter 75, a plurality of AND gates 77-1 to 77-4, and a plurality of counters 71-1 to 71-4.

For convenience of description in FIG. 5, it is illustrated that the plurality of banks 50 includes eight banks, and the disturb count circuit 63-3 counts the number of accesses by two banks.

It is illustrated that the plurality of OR gates 73-1 to 73-4, the plurality of AND gates 77-1 to 77-4, and the plurality of counters 71-1 to 71-4 are four, respectively, in FIG. 5; however, the present inventive concepts is not restricted thereto.

A first OR gate 73-1 may perform an OR operation on a first active signal PRD_0 occurring when a first bank is accessed and a second active signal PRD_1 occurring when a second bank is accessed, and transmit a result of the operation to a first AND gate 77-1. A second OR gate 73-2 may perform an OR operation on a third active signal PRD_2 occurring when a third bank is accessed and a fourth active signal PRD_3 occurring when a fourth bank is accessed, and transmit a result of the operation to a second AND gate 77-2.

A third OR gate 73-3 may perform an OR operation on a fifth active signal PRD_4 occurring when a fifth bank is accessed and a sixth active signal PRD_5 occurring when a sixth bank is accessed, and transmit a result of the operation to a third AND gate 77-3. A fourth OR gate 73-4 may perform an OR operation on a seventh active signal PRD_6 occurring when a seventh bank is accessed and an eighth active signal PRD_7 occurring when an eighth bank is accessed, and transmit a result of the operation to a fourth AND gate 77-4.

The inverter 75 may invert the refresh performance signal PRFH, and transmit the inverted signal to each of the plurality of AND gates 77-1 to 77-4. As illustrated in FIG. 3, an active signal generated according to a refresh operation is generated in a period where the refresh performance signal PRFH is activated, and thereby the number of accesses to memory cells accessed by a refresh operation may not be included through the inverter 75.

The first AND gate 77-1 may perform an AND operation on a signal inverted by the inverter 75 and an OR-operated result by the first OR gate 73-1, and transmit a result of the operation to a first counter 71-1. The second AND gate 77-2 may perform an AND operation on a signal inverted by the inverter 75 and an OR-operated result by the second OR gate 73-2, and transmit a result of the operation to a second counter 71-2.

The third AND gate 77-3 may perform an AND operation on a signal inverted by the inverter 75 and an OR-operated result by the third OR gate 73-3, and transmit a result of the operation to a third counter 71-3. The fourth And gate 77-4 may perform an AND operation on a signal inverted by the inverter 75 and an OR-operated result by the fourth OR gate 73-4, and transmit a result of the operation to a fourth counter 71-4.

The first counter 71-1 may count a result of the operation output from the first AND gate 77-1 during a fixed time, e.g., while the counter 63-1 counts the refresh command signal REFP to the reference number, and transmit a result of the counting to the disturb detection circuit 65-1. The second counter 71-2 may count a result of the operation output from the second AND gate 77-2 during the fixed time, and transmit a result of the counting to the disturb detection circuit 65-1.

The third counter 71-3 may count a result of the operation output from the third AND gate 77-3 during the fixed time, and transmit a result of the counting to the disturb detection circuit 65-1. The fourth counter 71-4 may count a result of the operation output from the fourth AND gate 77-4 during the fixed time, and transmit a result of the counting to the disturb detection circuit 65-1.

Each of the plurality of counter 71-1 to 71-4 may reset the result of the counting according to a control of the counter 63-1.

The disturb control circuit 65 may generate a refresh control signal RCCT for controlling a refresh interval of a refresh operation of a plurality of memory cells included in the plurality of banks 50 based on the result of the counting output from the disturb counter circuit 63-3, i.e., the counted number of accesses. Additionally, the disturb control circuit 65 may generate a refresh control signal RCCT for re-controlling the controlled refresh interval in response to a second control signal CTRL2 output from the refresh count circuit 67.

The disturb control circuit 65 may include a disturb detection circuit 65-1 and a signal generation circuit 65-3.

The disturb detection circuit 65-1 may compare the counted number of accesses output from the disturb counter circuit 63-3 to the reference number, generate a first control signal CTRL1 according to a result of the comparison, and output the first control signal CTRL1 to the signal generation circuit 65-3.

The disturb detection circuit 65-1 may include an OR gate 81 and a disturb detection logic 83. The OR gate 81 performs an OR operation on each count result of the plurality of counters 71-1 to 71-4 of the disturb count circuit 63-3, and transmit a result of the operation to the disturb detection logic 83.

The disturb detection logic 83 may compare an operation result of the OR gate 81, i.e., the counted number of accesses, to the reference number, generate a first control signal CTRL1 according to a result of the comparison, and output the first control signal CTRL1 to the signal generation circuit 65-3 and the refresh count circuit 67. For example, when the counted number of accesses is greater than or equal to the reference number, the disturb detection logic 83 may generate the first control signal CTRL1 having a first level, e.g., a high level or a logic 1.

When the counted number of accesses is less than the reference number, the disturb detection logic 83 may generate the first control signal CTRL1 having a second level, e.g., a low level or a logic 0.

The signal generation circuit 65-3 may generate a refresh control signal RCCT for controlling a refresh interval of a refresh operation for the plurality of memory cells included in the plurality of banks 50 in response to the control signal CTRL1.

For example, when the first control signal CTRL1 is at the first level, the signal generation circuit 65-3 may generate a refresh control signal RCCT for reducing the refresh interval of the refresh operation for the plurality of memory cells included in the plurality of banks 50.

When the first control signal CTRL1 is at the second level, the signal generation circuit 65-3 may generate a refresh control signal RCCT for maintaining or enlarging the refresh interval of the refresh operation for the plurality of memory cells included in the plurality of banks 50. In addition, the signal generation circuit 65-3 may generate a refresh control signal RCCT for re-controlling the controlled refresh interval controlled in response to the control signal CTRL2.

According to an example embodiment, the signal generation circuit 65-3 may be embodied in a R-S latch circuit.

After a refresh operation starts to be performed on the plurality of memory cells included in the plurality of banks 50 at the controlled refresh interval, the refresh count circuit 67 may check whether the refresh operation is performed on the plurality of memory cells based on a refresh address signal REF_RAS. For example, the refresh count circuit 67 may check whether the refresh operation is performed during a refresh cycle.

For example, the refresh count circuit 67 may count the refresh address signal REF_RAS output from a refresh scheduler 23-3 during a fixed time (e.g., a refresh cycle), and check whether a refresh operation is performed on the plurality of memory cells included in the plurality of banks 50.

The refresh count circuit 67 may generate a control signal CTRL2 when the plurality of memory cells is all refreshed according to a result of the checking For example, the refresh control block 23 may re-control, e.g., enlarge, reduce, or maintain, the controlled refresh interval of the memory device 100 in response to a signal RCCT for controlling the controlled refresh interval of the refresh operation for the plurality of memory cells included in the plurality of banks 50, and schedule a refresh operation of the memory device 100 at the re-controlled refresh interval.

Accordingly, the memory device 100 may prevent a disturb effect by a normal memory access operation, e.g., poor data storage of the plurality of memory cells, by frequently refreshing the plurality of memory cells included in the plurality of banks 50 according to a refresh scheduling of the refresh control block 23. In addition, the memory device 100 less frequently refreshes the plurality of memory cells included in the plurality of banks 50 according to a refresh scheduling of the refresh control block 23, and thereby power consumption by a refresh operation may be reduced.

Figure 7:
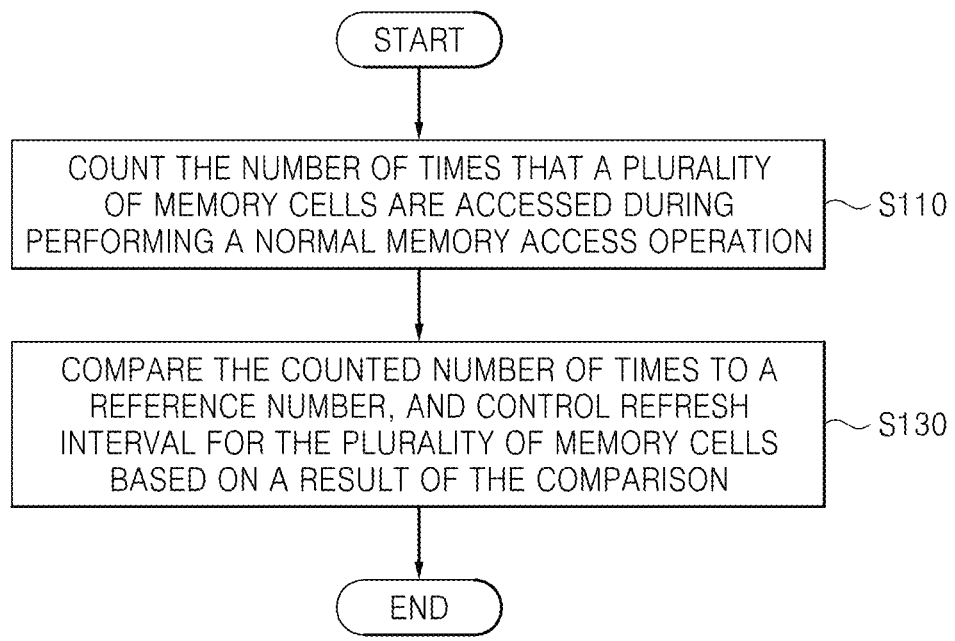
FIG. 7 is a flowchart for describing a method of operating the memory device according to an example embodiment.

FIG. 7 is a flowchart for describing a method of operating the memory device according to an example embodiment. Referring to FIG. 7, the memory device 100 may count the number of times that the plurality of memory cells are accessed when performing a normal memory access operation such as an active, a read, or a write operation during a fixed time based on the refresh performance signal PRFH and the active signal PRD (S110).

The memory device 100 may compare the counted number of times to the reference number, and control a refresh interval of a refresh operation for the plurality of memory cells according to a result of the comparison (S130).

Figure 8:
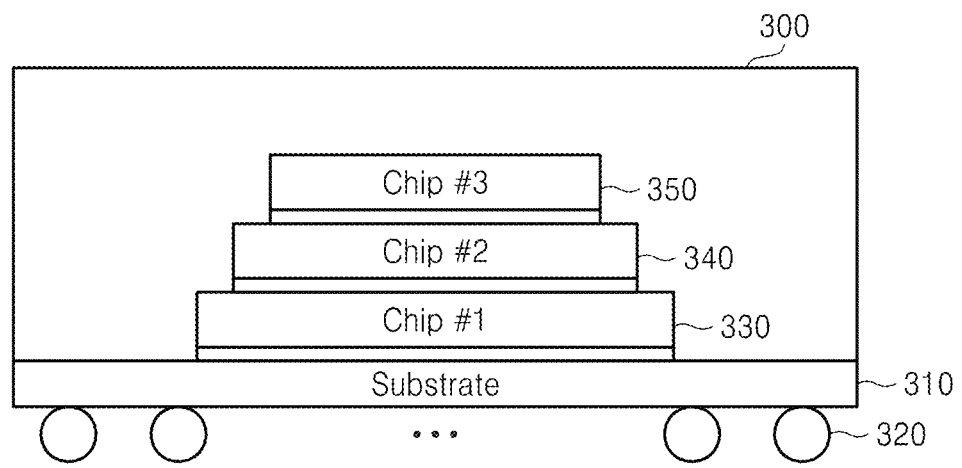
FIG. 8 is a conceptual diagram according to an example embodiment of a package including the memory device illustrated in FIG. 1.

FIG. 8 is a conceptual diagram according to an example embodiment of a package including the memory device illustrated in FIG. 1. Referring to FIG. 8, a package 300 may include a plurality of semiconductor devices 330, 340, and 350 sequentially stacked on a package substrate 310. Each of the plurality of semiconductor devices 330 to 350 may be the memory device 100 of FIG. 1.

The package 300 may be embodied in a Package On Package (PoP), Ball Grid Arrays (BGAs), Chip Scale Packages (CSPs), Plastic Leaded Chip Carrier (PLCC), Plastic Dual In-Line Package (PDIP), Chip On Board (COB), CERamic Dual In-Line Package (CERDIP), plastic metric quad flat pack (MQFP), Thin Quad Flat Pack (TQFP), small-outline integrated circuit (SOIC), shrink small outline package (SSOP), Thin small outline (TSOP), system in package (SIP), multi chip package (MCP), wafer-level package (WLP), or wafer-level processed stack package (WSP).

According to an example embodiment, a memory controller (not shown) may be embodied in one or more semiconductor device among a plurality of semiconductor devices 330 to 350, or may be embodied on the package substrate 310.

For an electrical connection between the plurality of semiconductor devices 330 to 350, electrical vertical connection means, e.g., Through-substrate via (TSV, e.g., through-silicon via), may be used.

The package 300 may be embodied in a Hybrid Memory Cube (hereinafter, referred to as "HMC") having a structure where the memory controller and a memory cell array die are stacked. By embodying the package in HMC, the memory device is improved in performance due to an increase in bandwidth, and power consumption and manufacturing cost may be reduced by minimizing an area occupied by the memory device.

Figure 9:
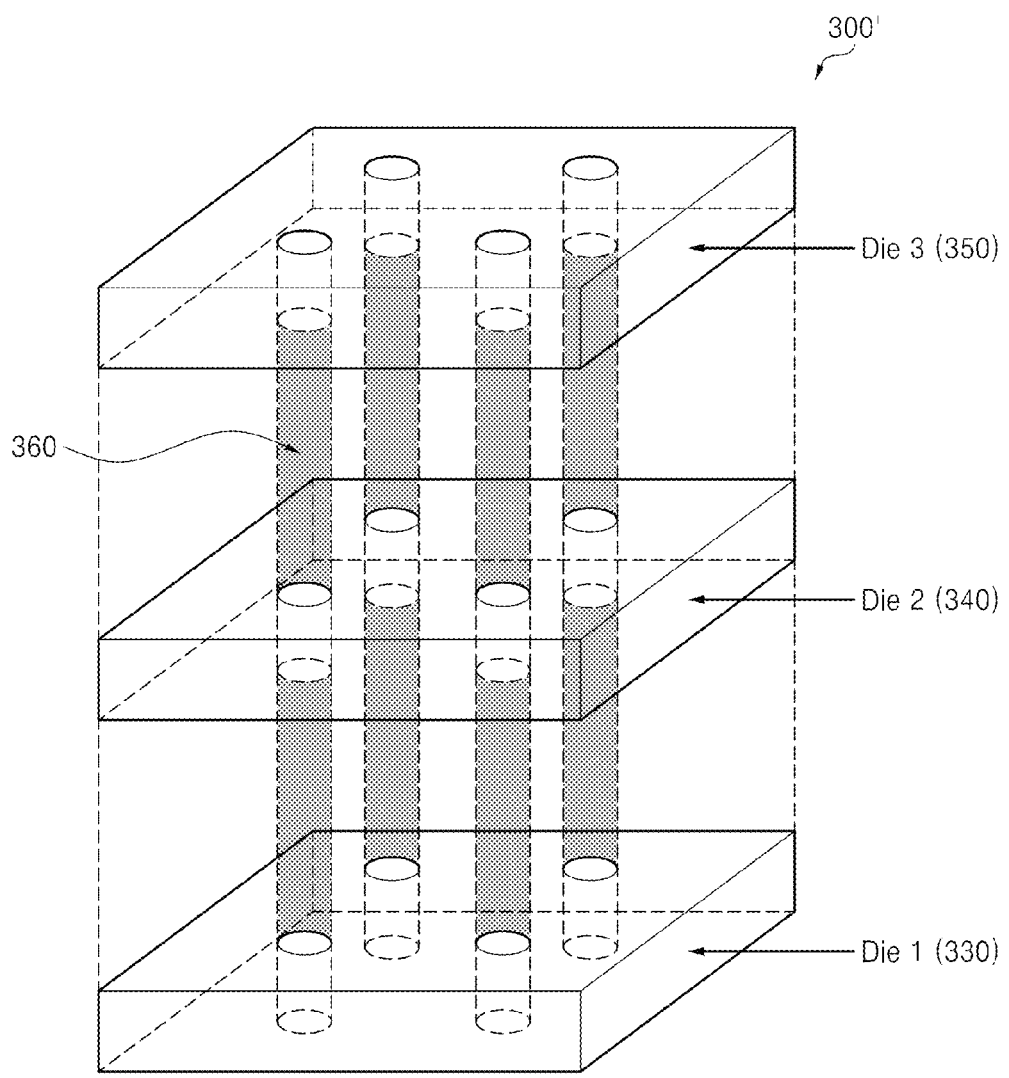
FIG. 9 is a conceptual diagram according to an example embodiment of the package including the memory device illustrated in FIG. 1.

FIG. 9 is a conceptual diagram according to an example embodiment of a package including the memory device illustrated in FIG. 1. Referring to FIG. 9, a package 300' may include a plurality of dies 330 to 350 in a stacked structure where each connected to each other through each TSV 360.

Figure 10:
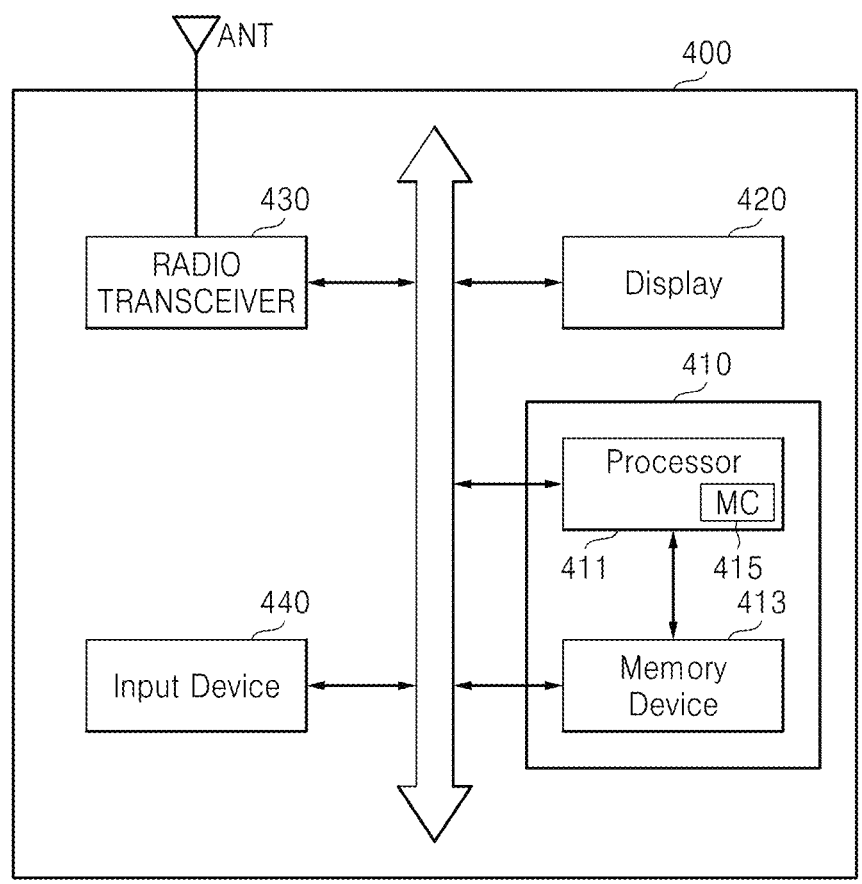
FIG. 10 is an example embodiment of a system including the memory device illustrated in FIG. 1.

FIG. 10 is an example embodiment of a system including the memory device illustrated in FIG. 1. Referring to FIG. 10, a system 400 may be embodied in an electronic device or portable electronic device.

The portable electronic device may be embodied, for example, in a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), or an e-book.

In one embodiment, the system 400 may include a processor 411 and a memory device 413. The memory device 413 may be the memory device 100 of FIG. 1. According to an example embodiment, the processor 411 and the memory device 413 may be packaged in a package 410. In this case, the package 410 may be mounted on a system board (not shown). The package 410 may denote the package 300 illustrated in FIG. 8 or the package 300' illustrated in FIG. 9.

The processor 411 may include a memory controller 415 which may control a data processing operation of the memory device 413, e.g., a write operation or a read operation. The memory controller 415 may be controlled by the processor 411 entirely controlling an operation of the system 400. According to an example embodiment, the memory controller 415 may be connected between the processor 411 and the memory device 413.

Data stored in the memory device 413 may be displayed through a display 420 according to a control of the processor 411.

A wireless transceiver 430 may transmit or receive a wireless signal through an antenna ANT. For example, the wireless transceiver 430 may convert a wireless signal received through the antenna ANT into a signal which may be processed by the processor 411. Accordingly, the processor 411 may process a signal output from the wireless transceiver 430, and store the processed signal in the memory device 413 or display the processed signal through the display 420. The wireless transceiver 430 may convert a signal output from the processor 411 into a wireless signal, and output the converted wireless signal to outside through the antenna ANT.

An input device 440, as a device which may input a control signal for controlling an operation of the processor 411 or data to be processed by the processor 411, may be embodied in a pointing device such as a touch pad and a computer mouse, a keypad, or keyboard.

The processor 411 may control the display 420 so that data output from the memory device 413, a wireless signal output from the wireless transceiver 430, or data output from the input device 440 may be displayed through the display 420.

Figure 11:
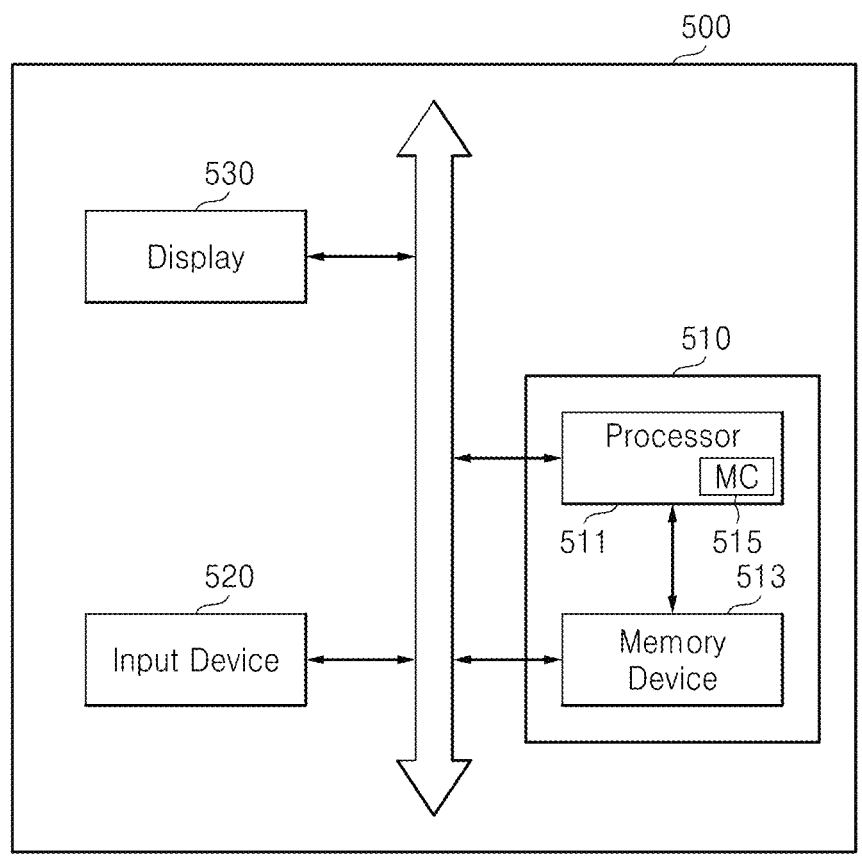
FIG. 11 is another example embodiment of the a system including the memory device illustrated in FIG. 1.

FIG. 11 is another example embodiment of the system including the memory device illustrated in FIG. 1. Referring to FIG. 11, a system 500 may be embodied, for example, in a personal computer (PC), a tablet PC, a net-book, an e-reader, a personal digital assistant (PDA), a portable multimedia player (PMP), a MP3 player, or a MP4 player.

In one embodiment, the system 500 may include a processor 511 for entirely controlling an operation of the system 500, and a memory device 513. The memory device 513 may denote the memory device 100 illustrated in FIG. 1. According to an example embodiment, the processor 511 and the memory device 513 may be packaged in a package 510. The package 510 may be mounted on a system board (not shown). The package 510 may denote the package 300 illustrated in FIG. 8 or the package 300' illustrated in FIG. 9.

The processor 511 may include a memory controller 515 controlling an operation of the memory device 513. The processor 511 may display data stored in the memory device 513 through a display 530 according to an input signal occurred by the input device 520. For example, the input device 520 may be embodied in a pointing device such as a touch pad or a computer mouse, a keypad, or a keyboard.

Figure 12:
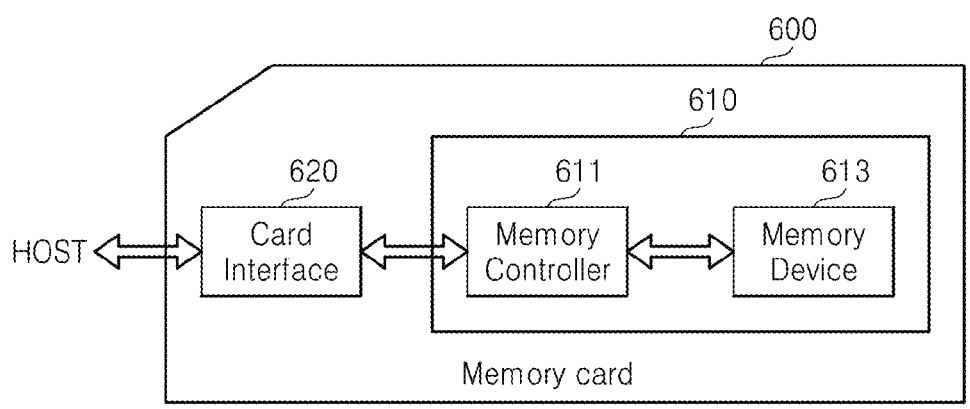
FIG. 12 is still another example embodiment of the system including the memory device illustrated in FIG. 1.

FIG. 12 is still another example embodiment of the system including the memory device illustrated in FIG. 1. Referring to FIG. 12, a system 600 may be embodied in a memory card or a smart card.

The system 600 may include a memory device 613, a memory controller 611, and a card interface 620. The memory device 613 may denote the memory device 100 illustrated in FIG. 1.

According to an example embodiment, the memory device 613 and the memory controller 611 may be packaged in a package. The package 610 may be mounted on a system board (not shown). The package 610 may denote the package 300 illustrated in FIG. 8 or the package 300' illustrated in FIG. 9.

The memory controller 611 may control data exchange between the memory device 613 and the card interface 620. According to an example embodiment, the card interface 620 may be a secure digital (SD) card interface, a multimedia card (MMC) interface, or an embedded-MMC (eMMC) interface; however, it is not restricted thereto.

The card interface 620 may interface data exchange between the host and the memory controller 611 according to a protocol of a host.

When the system 600 is connected to a host such as a computer, a digital camera, a digital audio player, a mobile phone, console video game hardware, or a digital set-top box, the host may transmit or receive data stored in the memory device 613 through the card interface 620 and the memory controller 611.

Figure 13:
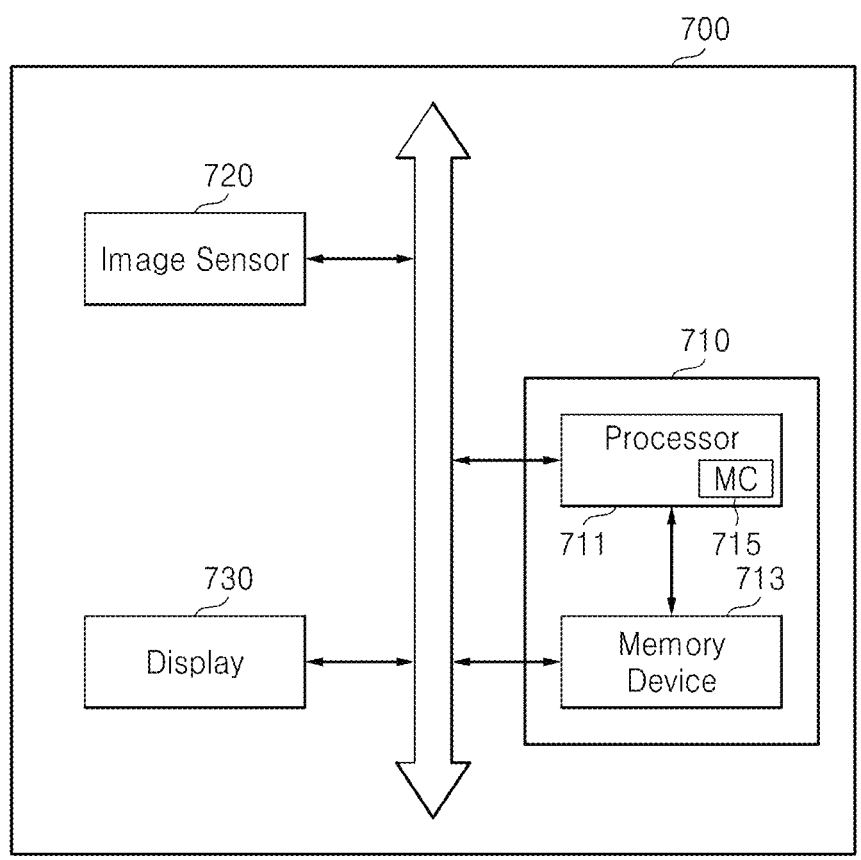
FIG. 13 is still another example embodiment of the system including the memory device illustrated in FIG. 1.

FIG. 13 is still another example embodiment of the system including the memory device illustrated in FIG. 1. Referring to FIG. 13, a system 700 may be embodied in a digital camera or a digital camera-installed portable device.

The system 700 may include a processor 711 entirely controlling an operation of the system 700 and a memory device 713. Here, the memory device 713 may denote the memory device 100 illustrated in FIG. 1.

According to an example embodiment, the processor 711 and the memory device 713 may be packaged in a package 710. The package 710 may be mounted on a system board (not shown). The package 710 may denote the package 300 illustrated in FIG. 8 or the package 300' illustrated in FIG. 9.

An image sensor 720 of the system 700 may convert an optical image into a digital signal, and the converted digital signal may be stored in the memory device 713 or displayed through the display 730 under a control of the processor 711. In addition, a digital signal stored in the memory device 713 may be displayed through the display 730 under a control of the processor 711.

Figure 14:
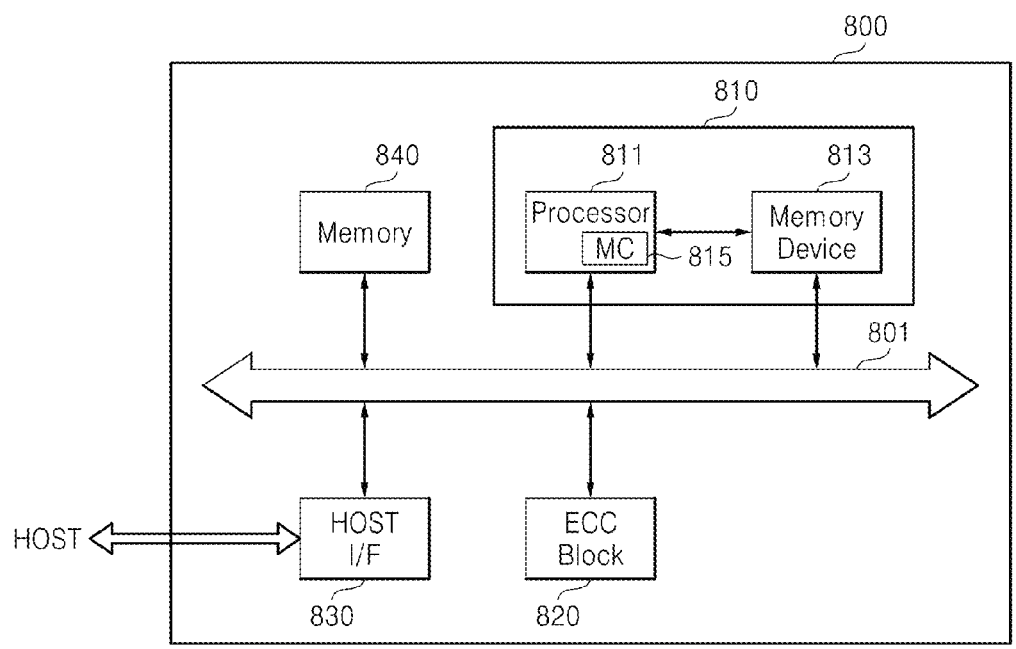
FIG. 14 is still another example embodiment of the system including the memory device illustrated in FIG. 1.

FIG. 14 is still another example embodiment of the system including the memory device illustrated in FIG. 1. Referring to FIG. 14, a system 800 may include a memory device 813 and a processor 811 which may entirely control an operation of the system 800. The memory device 813 may denote the memory device 100 illustrated in FIG. 1.

According to an example embodiment, the memory device 813 and the processor 811 may be packaged in a package 810. The package 810 may be mounted on a system board (not illustrated). The package 810 may denote the package 300 illustrated in FIG. 8 or the package 300' illustrated in FIG. 9.

The processor 811 may include a memory controller 815 for controlling an operation of the memory device 813. The system 800 may include a memory 840 which may be used as an operation memory of the processor 811. The memory 840 may be embodied in a non-volatile memory like a read only memory (ROM) or a flash memory.

A host connected to the system 800 may transmit or receive data to/from the memory device 813 through the processor 811 and a host interface 830. At this time, the memory controller 815 may perform a function of a memory interface. According to an example embodiment, the system 800 may further include an error correction code (ECC) block 820.

The ECC block 820 operating according to a control of the processor 811 may detect and correct an error included in data read from the memory device 813 through the memory controller 815. The processor 811 may control data exchange among the ECC block 820, the host interface 830, and the memory 840 through a bus 801.

The system 800 may be embodied in a Universal Serial Bus (USB) memory drive or a memory stick.

Figure 15:
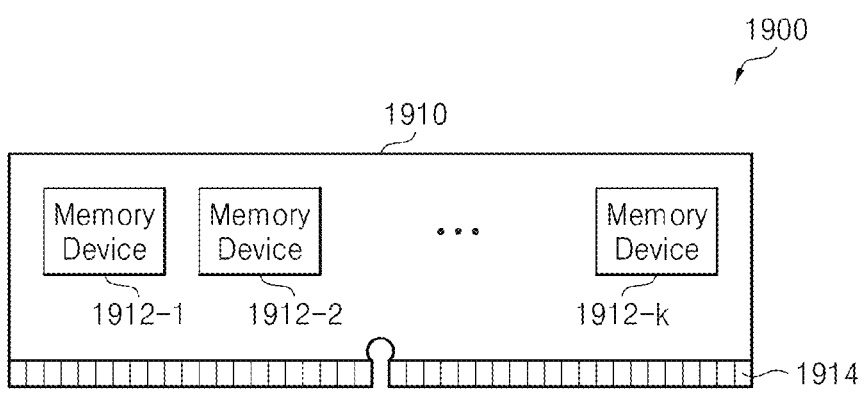
FIG. 15 is still another example embodiment of the system including the memory device illustrated in FIG. 1.

FIG. 15 is still another example embodiment of the system including the memory device illustrated in FIG. 1. Referring to FIG. 15, a system 1900, e.g., a memory module, may include memory devices 1912-1 to **1912-*k*, where k is a natural number, mounted on a printing circuit board (PCB) 1910. The PCB 1910 may include connection pins 1914**.

Each of the memory devices 1912-1 to 1912-k may be the memory device 100 illustrated in FIG. 1. The memory module may be a single in-line memory module (SIMM), a dual in-line memory module (DIMM), a load reduction dual in-line memory module (LRDIMM), a Fully Buffered DIMM (FBDIMM), a unregistered DIMM (UDIMM), a registered DIMM (RDIMM), or a small outline DIMM (SO-DIMM).

Figure 16:
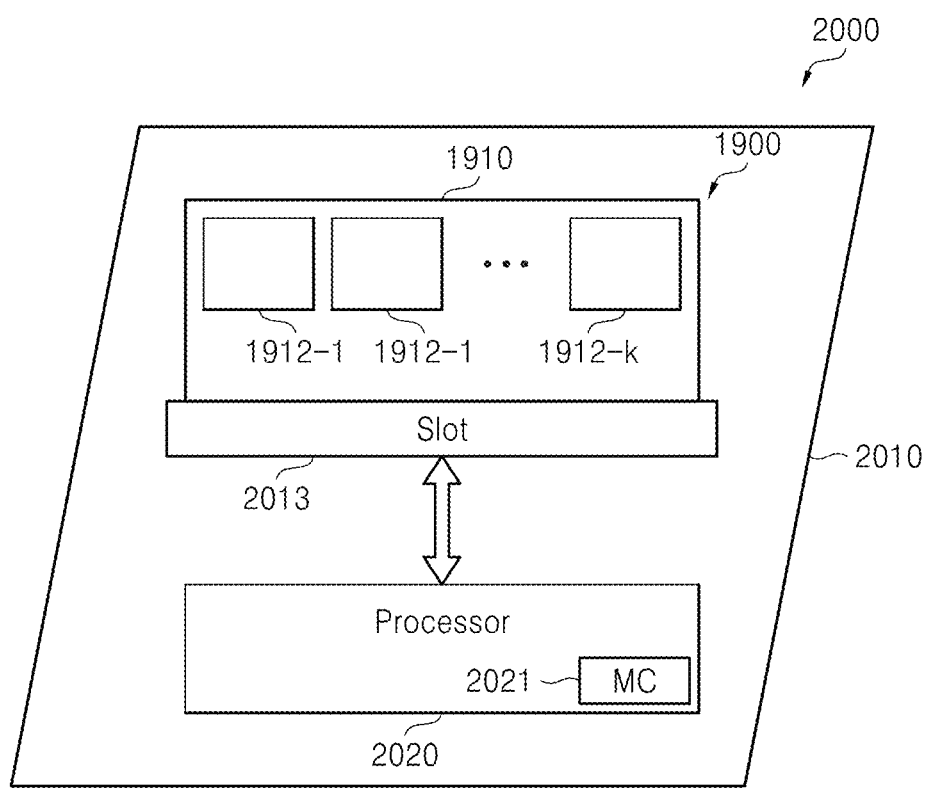
FIG. 16 is still another example embodiment of the system including the memory device illustrated in FIG. 1.

FIG. 16 is still another example embodiment of the system including the memory device illustrated in FIG. 1. Referring to FIGS. 15 and 16, a system 2000 may be embodied in a personal computer (PC), a laptop computer, or a server.

The system 2000 includes a memory module slot 2013 mounted in a main board 2010 and a processor 2020. Each of the memory devices 1912-1 to 1912-k of the memory module 1900 may transmit or receive data to/from the processor 2020 through the memory module slot 2013 and the main board 2010. Each f the plurality of devices 1912-1 to 1912-k may be the memory device 100 illustrated in FIG. 1. The processor 2020 may be a chip set. The processor 2020 may include a memory controller 2021 for controlling the memory devices 1912-1 to 1912-k.

Figure 17:
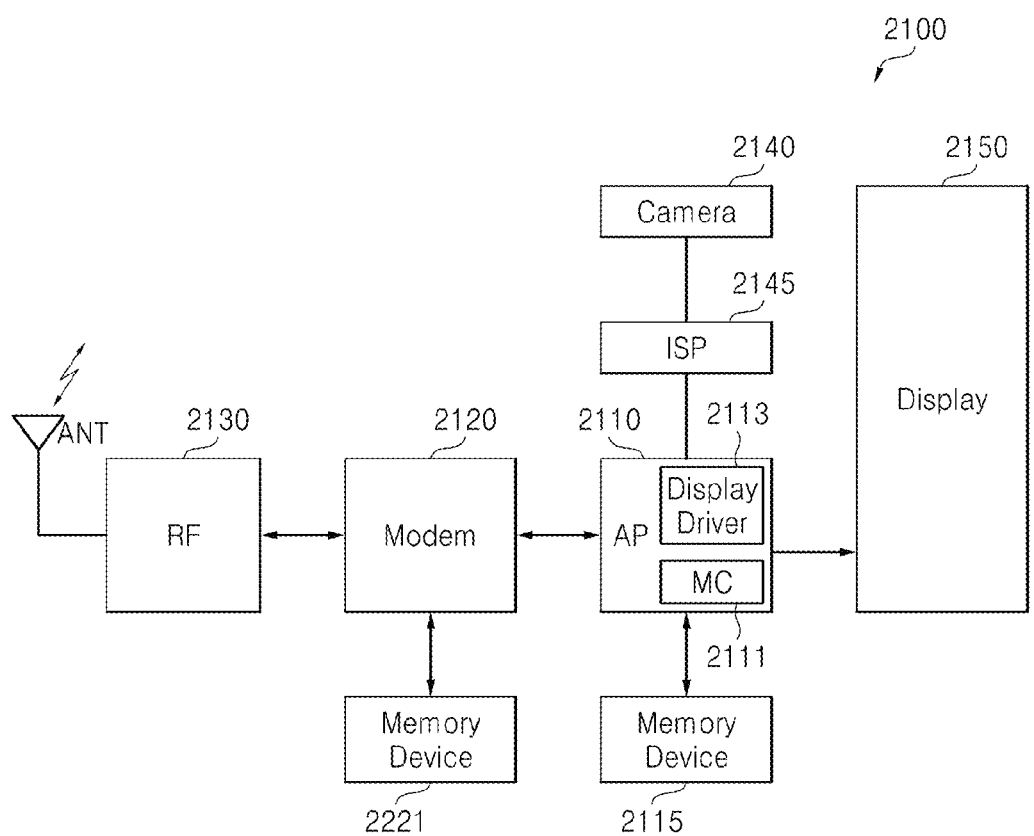
FIG. 17 is still another example embodiment of the system including the memory device illustrated in FIG. 1.

FIG. 17 is still another example embodiment of the system including the memory device illustrated in FIG. 1. As illustrated in FIG. 17, a system 2100 may be embodied in a mobile computing device.

The mobile computing device may be embodied, for example, in a laptop computer, a mobile phone, a smart phone, a tablet PC, a personal digital assistant (PDA), an enterprise digital assistant (EDA), a digital still camera, a portable multimedia player (PMP), personal navigation device or portable navigation device (PND), a handheld game console, or an e-book.

The application processor (AP) 2110, e.g., a mobile application processor 2110, may control an operation of each element 2115, 2120, 2145, and 2150.

Each memory device 2115 and 2221 may be the memory device 100 illustrated in FIG. 1.

The memory controller 2111 embodied in the application processor 2110 may control an access operation of the memory device 2115.

A display driver 2113 embodied in the application processor 2110 may control an operation of the display 2150. The display 2150 may be embodied, for example, in a thin film transistor liquid crystal display (TFT-LCD), a light-emitting diode (LED) display, an organic LED (OLED) display, an active-matrix OLED (AMOLED) display, or a flexible display.

A modem 2120 may interface data transmitted or received between the wireless transceiver 2130 and the application processor 2110. Data processed by the modem 2120 may be stored in the memory device 2221 or transmitted to the application processor 2110.

Wireless data received through the antenna ANT are transmitted to the modem 2120 through the wireless transceiver 2130, data output from the modem 2120 are converted to wireless data by the wireless transceiver 2130, and the converted wireless data are output through the antenna ANT. The image signal processor 2145 may process a signal output from a camera (or the image sensor 2140), and transmit the processed data to the application processor 2110.

The application processor 2110 may control at least one performance of web browsing, e-mail access, video playback, document editing, and image editing.

Figure 18:
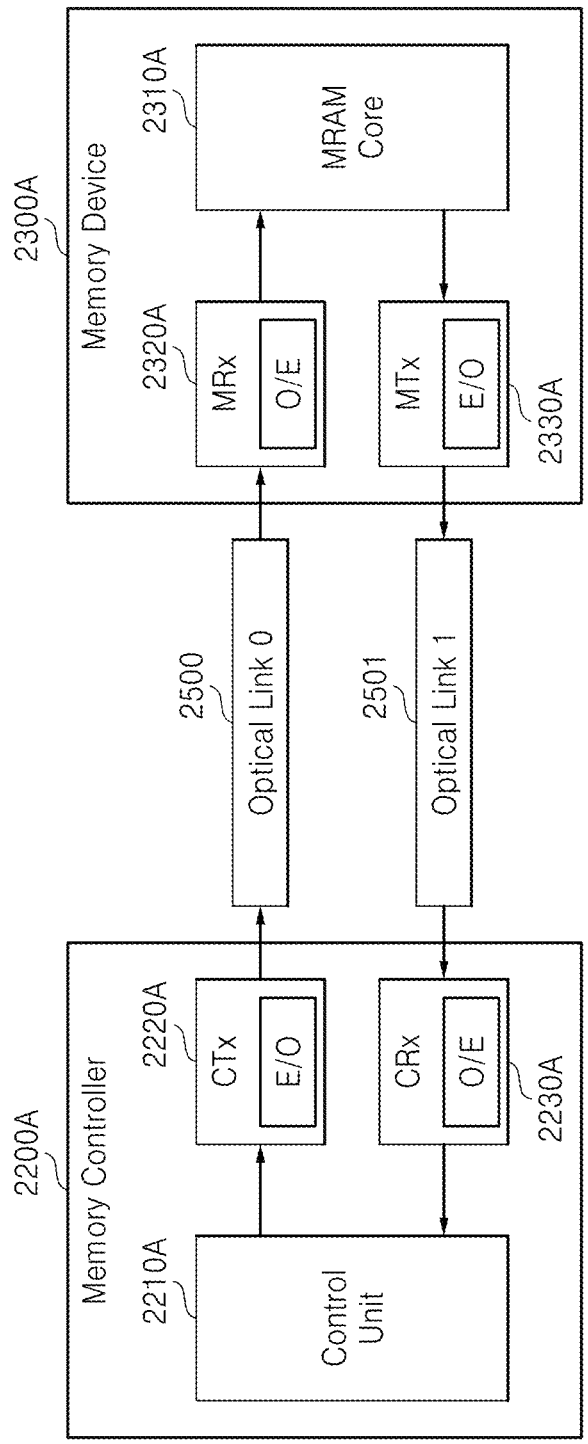
FIG. 18 is still another example embodiment of the system including the memory device illustrated in FIG. 1.

FIG. 18 is still another example embodiment of the system including the memory device illustrated in FIG. 1. Referring to FIG. 18, a memory system includes a memory controller 2200A and a memory device 2300A.

The memory controller 2200A includes a control unit 2210A, an optical transmitter 2220A including an electrical-to-optical (E/O) conversion device converting an electrical signal to an optical signal, and an optical receiver 2230A including an optical-to-electrical (O/E) conversion device converting an optical signal to an electrical signal.

The memory device 2300A includes a MRAM core 2310A, an optical receiver 2320A including an optical-to-electrical conversion device (O/E) converting an optical signal to an electrical signal, and an electrical-to-optical conversion device (E/O) converting an electrical signal to an optical signal.

The memory device 2300A may be the memory device 100 illustrated in FIG. 1.

Between the memory controller 2200A and the memory device 2300A, an optical link 0 2500 and an optical link 1 2501 for transmitting and receiving data are connected to each other. According to another example embodiment, the memory controller 2200A and the memory device 2300A may transmit and receive data through one optical link.

A method and devices according to disclosed embodiments may prevent poor data storage of a plurality of memory cells by a normal memory access operation by frequently refreshing the plurality of memory cells included in a plurality of banks according to a refresh scheduling. In addition, the method and the devices may reduce power consumption by a refresh operation by less frequently refreshing the plurality of memory cells according to the refresh scheduling.

The foregoing is illustrative of embodiments and is not to be construed as limiting thereof. Although a few embodiments have been described, those skilled in the art will readily appreciate that many modifications are possible without materially departing from the novel teachings and advantages of the disclosed embodiments. Accordingly, all such modifications are intended to be included within the scope of this inventive concept as defined in the claims.

What is claimed is:

1. A memory device comprising:
a plurality of memory cells;
an access control circuit configured to control an access to the plurality of memory cells; and
a control logic configured to control a refresh interval of a refresh operation for the plurality of memory cells based on the number of accesses to the plurality of memory cells during a first time period, and schedule the refresh operation at the controlled refresh interval,
wherein the control logic is configured to perform a refresh operation at a first refresh interval when the number of accesses to the plurality of memory cells is less than a reference number, and
wherein the control logic is configured to perform a refresh operation at a second refresh interval shorter than the first refresh interval when the number of accesses to the plurality of memory cells is equal to or greater than the reference number.

2. The memory device of claim 1, wherein the refresh interval is determined by the number of refresh commands input from outside the memory device.

3. The memory device of claim 1, wherein the refresh interval is controlled for one of the following:
a semiconductor chip, a bank, a row block, or a row line.

4. The memory device of claim 1, wherein the memory device is a dynamic random access memory (DRAM).

5. The memory device of claim 1, wherein the control logic includes:

a disturb detection block configured to count the number of accesses during the first time period, compare the counted number of accesses to the reference number, and generate a refresh control signal based on a result of the comparison; and a refresh control block configured to select one of the first refresh interval and the second refresh interval in response to the refresh control signal and schedule the refresh operation at the selected refresh interval.

6. The memory device of claim 5, wherein the disturb detection block is configured to reset the counted number of accesses after the first time period.

7. The memory device of claim 5, wherein the disturb detection block is configured to select the first refresh interval during a first refresh cycle, and select the second refresh interval during a second refresh cycle that occurs after the first refresh cycle.

8. The memory device of claim 5, wherein the number of accesses is counted for one of the following:
   a semiconductor chip, a bank, a row block, or a row line.

9. A computing system comprising:
   the memory device of claim 1; and
   a memory controller for controlling an operation of the memory device.

10. A method of operating a memory device including a plurality of memory cells connected to a plurality of word lines, the method comprising, during a refresh cycle:
    (a) counting a number of times that each of the plurality of word lines is accessed during a first time period;
    (b) comparing the number of times to a reference number; and
    (c) performing a refresh operation on the plurality of word lines based on a result of the comparison,
    wherein performing the refresh operation on the plurality of word lines comprises:
       (c1) performing the refresh operation at a first refresh interval when the number of times is less than the reference number; and
       (c2) performing the refresh operation at a second refresh interval shorter than the first refresh interval when the number of times is equal to or greater than the reference number.

11. The method of claim 10, wherein the plurality of word lines comprises one of the following:
    all word lines of the memory device, all word lines of a bank, or all word lines of a row block.

12. The method of claim 10, further comprising:
    performing steps (a) through (c) and (c1) for the plurality of word lines during a first refresh cycle; and
    performing steps (a) through (c) and (c2) for the plurality of word lines during a second refresh cycle that occurs after the first refresh cycle.

13. The method of claim 10, wherein performing the refresh operation at the second refresh interval includes refreshing one of the following:
    the memory device, a bank, or a row block.

* * * * *